United States Patent
Trivedi et al.

(10) Patent No.: US 8,629,732 B2
(45) Date of Patent: Jan. 14, 2014

(54) VOLTAGE-CONTROLLED OSCILLATORS AND RELATED SYSTEMS

(75) Inventors: Vishal P. Trivedi, Chandler, AZ (US); Kun-Hin To, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/250,385

(22) Filed: Sep. 30, 2011

(65) Prior Publication Data

US 2013/0082790 A1    Apr. 4, 2013

(51) Int. Cl.
    *H03B 1/00*    (2006.01)
(52) U.S. Cl.
    USPC ............ 331/177 V; 331/167; 331/117 R; 331/117 FE
(58) Field of Classification Search
    USPC ....... 331/167, 107 SL, 117 R, 117 FE, 177 V
    See application file for complete search history.

(56) References Cited

U.S. PATENT DOCUMENTS

| | | | |
|---|---|---|---|
| 5,629,652 A | 5/1997 | Weiss | |
| 6,661,301 B2 | 12/2003 | Traub | |
| 6,806,785 B2 | 10/2004 | Traub | |
| 7,688,153 B2 * | 3/2010 | Jacobsson et al. | 331/117 FE |
| 7,737,797 B2 * | 6/2010 | Shen | 331/117 R |
| 2004/0012450 A1 | 1/2004 | Nguyen | |
| 2005/0275478 A1 * | 12/2005 | Tsukizawa et al. | 331/117 R |
| 2006/0049881 A1 * | 3/2006 | Rein et al. | 331/74 |
| 2008/0309435 A1 | 12/2008 | Wu | |
| 2009/0167593 A1 | 7/2009 | Storz et al. | |
| 2009/0231051 A1 | 9/2009 | Tokuyama | |
| 2009/0302958 A1 | 12/2009 | Sakurai et al. | |
| 2011/0102093 A1 | 5/2011 | El Rai et al. | |
| 2011/0187420 A1 | 8/2011 | Kuo et al. | |
| 2012/0161890 A1 | 6/2012 | Li et al. | |
| 2012/0169428 A1 | 7/2012 | Maarefi et al. | |

FOREIGN PATENT DOCUMENTS

WO    2010092491 A2    8/2010

OTHER PUBLICATIONS http:/academic.udayton.edu/lenoPedrotti/text232/ch8.pdf.*
USPTO "Non-Final Office Action" mailed Jul. 12, 2012; U.S. Appl. No. 13/051,611, filed Mar. 18, 2011.
Hegazi, E., et al. "A Filtering Technique to Lower LC Oscillator Phase Noise," IEEE Journal of Solid-State Circuits, vol. 36, No. 12, Dec. 2001. pp. 1921-1930.
Ak/ Salle, D., et al. "A Fully Integrated 77GHz FMCW Radar Transmitter Using a Fractional-N Frequency Synthesizer," Proceedings of the 6th European Radar Conference, Sep. 30-Oct. 2, 2009. pp. 149-152.

(Continued)

*Primary Examiner* — Arnold Kinkead
(74) *Attorney, Agent, or Firm* — Ingrassia Fisher & Lorenz, P.C.

(57) ABSTRACT

Apparatus are provided for voltage-controlled oscillators and related systems. An exemplary voltage-controlled oscillator includes a first variable capacitance element, a second variable capacitance element coupled between the first control voltage node and the third node, and an inductive element coupled between the variable capacitance elements to provide an inductance between the variable capacitance elements at an oscillation frequency of an oscillating signal at an output node. The first variable capacitance element is coupled between a first control voltage node and the output node, the second variable capacitance element is coupled to the first control voltage node, and a second inductive element is coupled between the second variable capacitance element and a second control voltage node.

20 Claims, 3 Drawing Sheets

(56) References Cited

OTHER PUBLICATIONS

Shanan, H., et al. "A Technique to Reduce Flicker Noise Up-Conversion in CMOS LC Voltage-Controlled Oscillators," 30th European Solid-State Circuits Conference, Sep. 21-23, 2004. pp. 123-126.

Zhan, J.H.C., et al. "A Comparative Study of MOS VCOs for Low Voltage High Performance Operation," Proc. of 2004 Int. Symp. On Low Power Electronics and Design, pp. 244-247.

Zhan, J.H.C., et al. "A Comparative Study of Common MOS VCO Topologies," downloaded from http://domino.watson.ibm.com/acas/w3www_acas.nsf/images/projects_03.04/$File/kornegay.pdf.

Carman, E., et al. "V-Band and W-Band Broad-Band, Monolithic Distributed Frequency Multipliers," IEEE Microwave and Guided Wave Letters, vol. 2, No. 6, Jun. 1992, pp. 253-254.

Rodwell, M., et al. "Active and Nonlinear Wave Propagation Devices in Ultrafast Electronics and Optoelectronics," Proceedings of the IEEE, vol. 82, No. 7, Jul. 1994, pp. 1037-1059.

Trivedi, V., et al. "Voltage-Controlled Oscillators and Related Systems," U.S. Appl. No. 13/051,611, filed Mar. 18, 2011.

USPTO, Final Office Action for U.S. Appl. No. 13/051,611, mailed Feb. 26, 2013.

USPTO, Response to Final Office Action dated Feb. 26, 2013, for U.S. Appl. No. 13/051,611, filed May 17, 2013.

Chaivipas, W., et al., "Fine and Wide Frequency Tuning Digital Controlled Oscillators Utilizing Capacitance Position Sensitivity in Distribute Resonators", 2007 IEEE Asian Solid-State Circuits Conference, Nov. 2007, pp. 424-427.

European Patent Office, European Search Report for Application No. 12185914.4-1805/2575259 dated Nov. 12, 2013.

USPTO, Office Action for U.S. Appl. No. 13/051,611, mailed Aug. 1, 2013.

* cited by examiner

VOLTAGE-CONTROLLED OSCILLATORS AND RELATED SYSTEMS

TECHNICAL FIELD

The subject matter described herein relates generally to electronic circuits, and more particularly, embodiments of the subject matter relate to voltage-controlled oscillators and related circuit topologies and systems.

BACKGROUND

Voltage-controlled oscillators (VCOs) are commonly used to produce an oscillating signal that oscillates at a desired frequency in response to an applied voltage (or control voltage). For example, phase-locked loops (PLLs) may utilize a VCO to generate a signal having a particular oscillation frequency. In most systems, the VCO is designed to accommodate a range of possible oscillation frequencies over a predetermined input voltage range.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments of the subject matter described herein relate to voltage-controlled oscillators (VCOs) capable of achieving relatively low phase noise and/or relatively high power output at or near a particular oscillation frequency of interest. For example, in applications where the VCO primarily operates at a particular oscillation frequency of interest, is desirable to reduce phase noise and/or increase efficiency rather than designing the VCO to accommodate a wider range of oscillation frequencies. As described in greater detail below, an exemplary VCO includes an oscillator arrangement and a resonator arrangement, wherein the resonator arrangement includes a plurality of variable capacitance elements (or varactors) that are distributed between the output of the oscillator arrangement and a direct current (DC) voltage (a DC tuning voltage or control voltage). In this regard, a pair of variable capacitance elements are "distributed" if a non-negligible inductance exists between a set of terminals of the variable capacitance elements. In other words, the pair of variable capacitance elements would be non-distributed (or "lumped") and configured electrically in parallel to one another in the absence of the non-negligible inductance. In exemplary embodiments, variable capacitive elements are distributed using transmission line elements having non-negligible lengths at the oscillating frequency to increase the quality factor (or Q value) of the resonator arrangement by virtue of the inductances between the variable capacitance elements, as described in greater detail below. As a result, the phase noise and output power for the VCO at the oscillating frequency can be improved.

Figure 1:
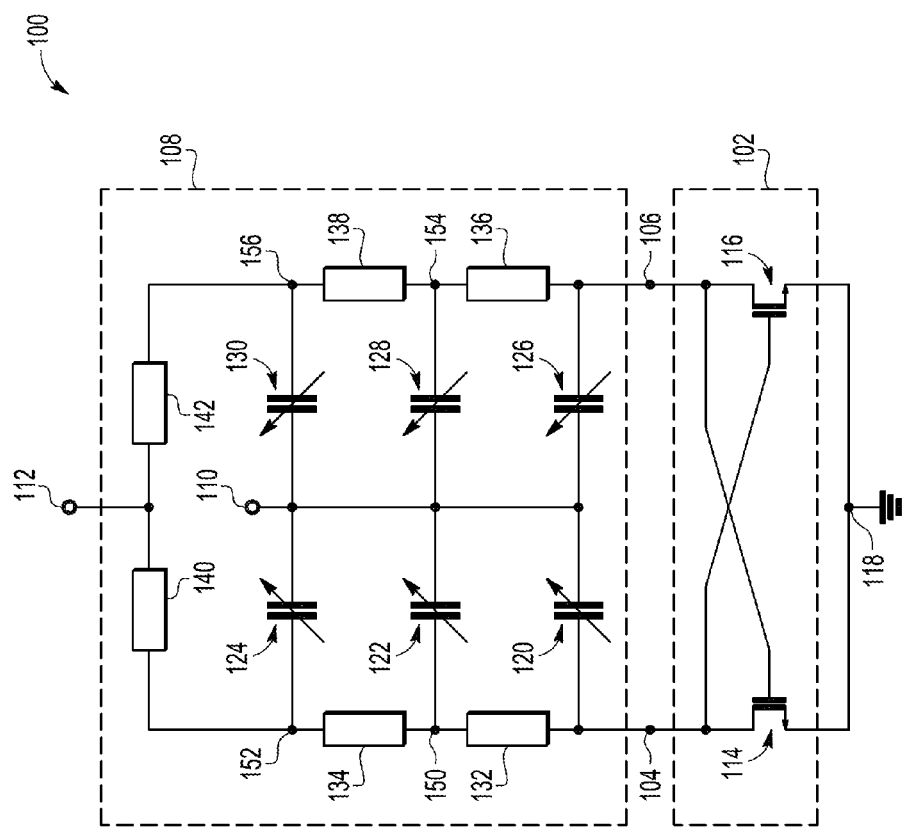
FIG. 1 is a schematic view of a voltage-controlled oscillator module in accordance with one embodiment of the invention.

Referring now to FIG. 1, an exemplary voltage-controlled oscillator module 100 includes, without limitation, an oscillator arrangement 102 configured to facilitate generation of a pair of oscillating signals at a pair of output nodes 104, 106 and a resonator arrangement 108 coupled to the output nodes 104, 106 of the oscillator arrangement 102. The resonator arrangement 108 is capable of being tuned to a particular resonant frequency from a range of possible resonant frequencies based on a direct current (DC) voltage differential between a first control voltage node 110 and a second control voltage node 112, wherein the oscillation frequency of the oscillating signals at the output nodes 104, 106 is governed or otherwise influenced by the tuned resonant frequency provided by the resonator arrangement 108. As used herein, "oscillation frequency," "oscillating frequency," and variants thereof should be understood as referring to the frequency of the oscillating signals at the output nodes 104, 106. Furthermore, "corresponding to" and other words of similar import may be used herein in the context of the oscillation frequency to describe the relationship between the oscillation frequency and the tuned resonant frequency, and should not be construed as implying or otherwise requiring the oscillation frequency be equal to the tuned resonant frequency. In practice, various circuit level effects, such as component variations or parasitic capacitances, inductances, and/or resistances typically result in the oscillation frequency being different from the tuned resonant frequency, and in practice, the oscillation frequency and the tuned resonant frequency may differ by as much as thirty to fifty percent or more.

In the illustrated embodiment, the oscillator arrangement 102 is realized as an active-circuit arrangement that includes a pair of cross-coupled transistors 114, 116 configured to facilitate the oscillating signals at the output nodes 104, 106. In this regard, the oscillating signals at the output nodes 104, 106 are components of a differential oscillating signal, that is, the phase difference between the first oscillating signal at the first output node 104 and the second oscillating signal at the second output node 106 is substantially equal to 180°. In other words, the first oscillating signal at the first output node 104 is the logical inverse of (or complementary to) the second oscillating signal at the second output node 106. As illustrated in FIG. 1, for an implementation using n-type transistors, the drain terminal of the first transistor 114 and the gate terminal of the second transistor 116 are each coupled to the first output node 104, and the gate terminal of the first transistor 114 and the drain terminal of the second transistor 116 are each coupled to the second output node 106. The source terminals of the transistors 114, 116 are coupled to one another at a common source node 118, such that the gate and drain voltages of the transistors 114, 116 are all referenced relative to the same source voltage. In an exemplary embodiment, the common source node 118 is coupled to or otherwise configured to receive a DC ground reference voltage for the VCO module 100, wherein the nominal DC voltages at the output nodes 104, 106 function as bias voltages that bias the transistors 114, 116 in the saturation region, which results in the transistors 114, 116 oscillating between the on and off states at the oscillation frequency by virtue of the cross-coupled configuration. It should be noted that although FIG. 1 depicts an implementation using n-type MOSFETs (e.g., NMOS) for the cross-coupled oscillator arrangement 102, numerous equivalent circuits may be implemented (e.g., using bipolar junction transistors or PMOS transistors for the cross-coupled oscillator arrangement 102 with ground and supply terminals swapped) or the cross-coupled oscillator arrangement 102 may be implemented in a complementary manner (e.g., using both NMOS and PMOS transistors).

As described above, the resonator arrangement 108 is capable of being tuned to a particular resonant frequency from a range of possible resonant frequencies, wherein the tuned resonant frequency dictates or otherwise influences the oscillation frequency of the oscillating signals at the output nodes 104, 106. In exemplary embodiment, the first control voltage node 110 receives a first DC control voltage (or tuning voltage) and the second control voltage node 112 receives a second DC control voltage. In an exemplary embodiment, the resonator arrangement 108 is realized as a tank circuit including a plurality of variable capacitance elements 120, 122, 124, 126, 128, 130 and a plurality of inductive elements 132, 134, 136, 138, 140, 142. The respective capacitances of the variable capacitance elements 120, 122, 124, 126, 128, 130 are based on the respective DC voltage differences between terminals of the respective variable capacitance elements 120, 122, 124, 126, 128, 130. In this manner, the tuned resonant frequency of the resonator arrangement 108 is based on the DC voltage difference between the first control voltage at node 110 and the second control voltage at node 112. As described in greater detail below in the context of FIG. 2, in an exemplary embodiment, each variable capacitance element 120, 122, 124, 126, 128, 130 is realized as a varactor arrangement that includes one or more varactors configured electrically parallel to one another.

As illustrated in FIG. 1, each variable capacitance element 120, 122, 124, 126, 128, 130 has a terminal (e.g., a cathode terminal) connected to the first control voltage node 110, wherein the opposing terminal (e.g., an anode terminal) of each variable capacitance element 120, 122, 124, 126, 128, 130 is coupled to the opposing terminal of another of the variable capacitance elements 120, 122, 124, 126, 128, 130 via one of the inductive elements 132, 134, 136, 138. For example, in an exemplary embodiment, a first variable capacitance element 120 has a first terminal (e.g., a cathode terminal) connected to the first control voltage node 110 and a second terminal (e.g., an anode terminal) connected to the first output node 104, such that the first variable capacitance element 120 is electrically in series between nodes 104, 110, and a second variable capacitance element 122 has its first terminal (e.g., its cathode terminal) connected to the first control voltage node 110 and its second terminal (e.g., its anode terminal) connected to another node 150, such that the second variable capacitance elements 122 is electrically in series between nodes 110, 150. A first inductive element 132 is connected in series between the first output node 104 and node 150 and provides a non-negligible inductance between the nodes 104, 150 at the oscillating frequency of the oscillating signal at the first output node 104. The inductance of the first inductive element 132 results in a non-negligible alternating current (AC) voltage differential between the first output node 104 and node 150. In an exemplary embodiment, the AC voltage difference between nodes 104, 150 is greater than about five percent of the amplitude of the oscillating signal at the first output node 104. In a similar manner, a third variable capacitance element 124 has its first terminal connected to the first control voltage node 110 and its second terminal connected to another node 152, wherein a second inductive element 134 is coupled in series between the nodes 150, 152 to provide a non-negligible inductance (and thereby, a non-negligible AC voltage difference) between the nodes 150, 152 at the oscillation frequency. In a similar manner, a fourth variable capacitance element 126 has its first terminal connected to the first control voltage node 110 and its second terminal connected to the second output node 106, a fifth variable capacitance element 128 has its first terminal connected to the first control voltage node 110 and its second terminal connected to node 154, and a sixth variable capacitance element 130 has its first terminal connected to the first control voltage node 110 and its second terminal connected to node 156, wherein a third inductive element 136 is coupled in series between nodes 106, 154 to provide an inductance between the second output node 106 and node 154, and a fourth inductive element 138 is coupled in series between nodes 154, 156 to provide an inductance between node 154 and node 156.

In the illustrated embodiment, a fifth inductive element 140 is coupled in series between the second control voltage node 112 and the second terminal of the third variable capacitance element 124 at node 152 and a sixth inductive element 142 is coupled in series between the second control voltage node 112 and the second terminal of the sixth variable capacitance element 130 at node 156. In exemplary embodiments, each of the inductive elements 132, 134, 136, 138, 140, 142 is realized as a transmission line element, such as a microstrip line or another conductive element, having a non-negligible length with respect to the wavelength of the oscillating signals within the transmission line element to provide a non-negligible inductance. In this regard, for a microstrip line, the length of the microstrip line is non-negligible with respect to the wavelength of the oscillating signals in the dielectric medium between the microstrip line and the ground plane. In accordance with one or more embodiments, each of the inductive elements 132, 134, 136, 138 is realized as a transmission line element (e.g., a microstrip line) having a length greater than or equal to about one hundredth of the wavelength of the oscillating signal within the transmission line element. The length of the transmission line elements 132, 134, 136, 138 provide inductances that result in non-negligible AC voltage drops across the transmission line elements 132, 134, 136, 138. By virtue of the AC voltage drops across the transmission line elements 132, 134, 136, 138, the current flowing to/from the upper variable capacitive elements 124, 130 (i.e., the variable capacitive elements closest to the second control voltage node 112) is less than the current flowing to/from variable capacitive elements 122, 128, which is less than the current flowing to/from the lower variable capacitive elements 120, 126 coupled to the output nodes 104, 106. As a result, the ohmic losses in the resonator arrangement 108 are reduced relative to conventional resonators having lumped variable capacitive elements (e.g., where the adjacent variable capacitive elements are effectively in parallel between the first control voltage node 110 and a respective output node 104, 106), thereby improving the quality factor (or Q value) and reducing the phase noise of the resonator arrangement 108.

Still referring to FIG. 1, the DC voltage difference between the first control voltage (or tuning voltage) at node 110 and the second control voltage (or tuning voltage) at node 112 is applied across the variable capacitance elements 120, 122, 124, 126, 128, 130 to control the capacitance of the variable capacitance elements 120, 122, 124, 126, 128, 130, and thereby, the resonant frequency provided by the resonator arrangement 108. In an exemplary embodiment, the range of possible capacitances capable of being provided by the variable capacitance elements 120, 122, 124, 126, 128, 130 with respect to the range of possible control voltages at the control voltage nodes 110, 112 and the inductances of the inductive elements 132, 134, 136, 138, 140, 142 are chosen to provide a desired range of possible resonant frequencies for the resonator arrangement 108. For example, in accordance with one embodiment, the inductive elements 132, 134, 136, 138, 140, 142 provide a total effective inductance in the range of about 80 picohenries (pH) to about 100 pH and the variable capacitance elements are designed to have a capacitance in the range of about 26 femtofarads (fF) to about 128 fF over a control voltage differential from about −2.5 Volts to about 2.5 Volts to provide a range of possible oscillation frequencies for the VCO module 100 in the range of about 35 GHz to about 45 GHz.

It should be understood that FIG. 1 is a simplified representation of a VCO module 100 for purposes of explanation and ease of description, and FIG. 1 is not intended to limit the application or scope of the subject matter in any way. Thus, although FIG. 1 depicts direct electrical connections between circuit elements and/or terminals, alternative embodiments may employ intervening circuit elements and/or components while functioning in a substantially similar manner. Furthermore, although FIG. 1 depicts the resonator arrangement 108 as being connected to the output nodes 104, 106 of the oscillator arrangement 102, in other embodiments, the resonator arrangement 108 may be capacitively coupled to the oscillator arrangement 102 as described in U.S. patent application Ser. No. 13/051,611, filed Mar. 18, 2011, entitled "VOLTAGE-CONTROLLED OSCILLATORS AND RELATED SYSTEMS", and assigned to the assignee of the present application, the entirety of which is incorporated by reference herein.

Figure 2:
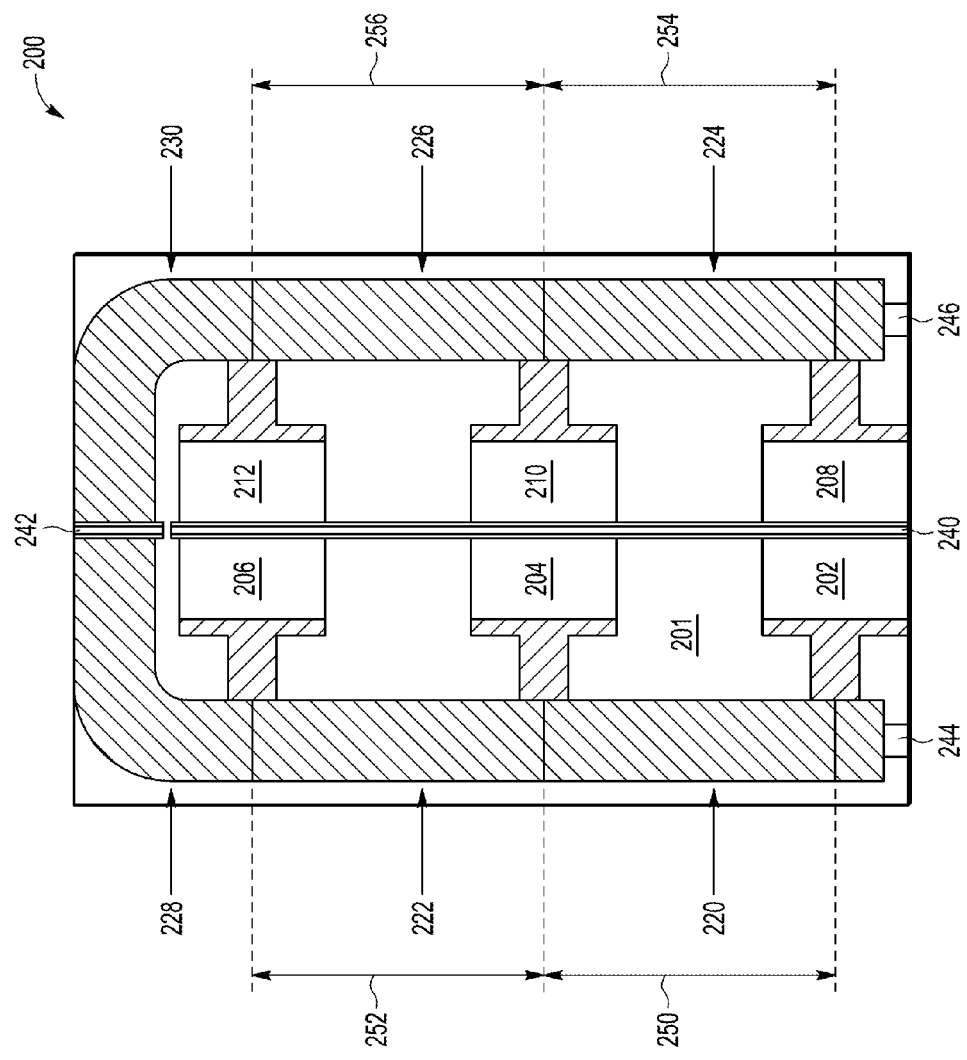
FIG. 2 is a top view of a layout of a resonator arrangement suitable for use in the voltage-controlled oscillator module of FIG. 1 in accordance with one embodiment of the invention.

Turning now to FIG. 2, an exemplary resonator arrangement 200 suitable for use as the resonator arrangement 108 in the VCO module 100 of FIG. 1 includes, without limitation, a plurality of variable capacitance elements 202, 204, 206, 208, 210, 212 and a plurality of transmission line elements 220, 222, 224, 226, 228, 230. As described above, a first set of the variable capacitance elements 202, 204, 206 are each coupled to a first control voltage node 240 (e.g., the first control voltage node 110), and the variable capacitance elements 202, 204, 206 distributed between a node 244 configured to be coupled to external circuitry (e.g., to the first output node 104 of the oscillator arrangement 102) and a second control voltage node 242 (e.g., the second control voltage node 112). Similarly, the second set of the variable capacitance elements 208, 210, 212 are each coupled to the first control voltage node 240 and distributed between a second node 246 configured to be coupled to external circuitry (e.g., to the second output node 106 of the oscillator arrangement 102) and the second control voltage node 242.

In exemplary embodiments, each of the variable capacitance elements 202, 204, 206, 208, 210, 212 is realized as a varactor arrangement that includes one or more varactors configured electrically parallel to one another. For example, a first variable capacitance element 202 (e.g., first variable capacitance element 120) may include one or more MOS varactors formed overlying a substrate 201 (e.g., a semiconductor substrate, a circuit board, or another suitable electronics substrate), wherein the cathode terminal(s) of the one or more varactors is coupled to the first control voltage node 240, which may be realized as a metal trace (e.g., in a metal layer formed overlying the first variable capacitance element 202) or another conductive element. Similarly, a second variable capacitance element 204 (e.g., second variable capacitance element 122) includes one or more MOS varactors overlying the substrate 201 having cathode terminal(s) coupled to the first control voltage node 240. A first transmission line element 220 (e.g., first inductive element 132) is connected between the anode terminal(s) of the varactor(s) of the first variable capacitance element 202 and the anode terminal(s) of the varactor(s) of the second variable capacitance element 204. As illustrated in FIG. 2, the first and second variable capacitance elements 202, 204 are distributed or otherwise spaced apart by a distance that corresponds to the length 250 of the first transmission line element 220 between the first and second variable capacitance elements 202, 204. The length 250 of the first transmission line element 220 is non-negligible at the frequency of the signals generated by the external circuitry coupled to the node 244 and propagating in the first transmission line element 220 to provide an inductance that creates a non-negligible AC voltage drop between the anode terminal(s) of the first variable capacitance element 202 and the anode terminal(s) of the second variable capacitance element 204. In exemplary embodiments, the length 250 of the first transmission line element 220 between the first and second variable capacitance elements 202, 204 is greater than a hundredth of the wavelength of the oscillating signals at node 244. For example, in one embodiment, the signals at the node 244 oscillate with a frequency of 40 GHz and the length 250 of the first transmission line element 220 is about 40 microns (μm) or greater.

In a similar manner, the second and third variable capacitance elements 204, 206 are distributed or otherwise spaced apart by a distance that corresponds to the length 252 of a second transmission line element 222 coupled between the second and third variable capacitance elements 204, 206, wherein the length 252 of the second transmission line element 222 provides a non-negligible AC voltage drop between the anode terminal(s) of the second variable capacitance element 204 and the anode terminal(s) of the third variable capacitance element 206 at the oscillation frequency. Likewise, the fourth and fifth variable capacitance elements 208, 210 are distributed by a distance that corresponds to the length 254 of a third transmission line element 226 coupled between the fourth and fifth variable capacitance elements 208, 210 to provide an AC voltage drop between the fourth and fifth variable capacitance elements 208, 210 at the frequency of the oscillating signals at node 246, and the firth and sixth variable capacitance elements 210, 212 are distributed by a distance corresponding to the length 256 of a fourth transmission line element 228 coupled between the fifth and sixth variable capacitance elements 210, 212 to provide an AC voltage drop between the fifth and sixth variable capacitance elements 210, 212. In the illustrated embodiment, for a differential implementation, the resonator arrangement 200 is substantially symmetric, such that the length 254 of the third transmission line element 224 is substantially equal to the length 250 of the first transmission line element 220 and the length 256 of the fourth transmission line element 226 is substantially equal to the length 252 of the second transmission line element 222.

Still referring to FIG. 2, a fifth transmission line element 228 (e.g., fifth inductive element 140) is coupled between the third variable capacitance element 206 and the second control voltage node 242 and a sixth transmission line element 230 (e.g., sixth inductive element 142) is coupled between the sixth variable capacitance element 212 and the second control voltage node 242. As described above, the combined length of the transmission line elements 220, 222, 224, 226, 228, 230 is chosen to provide a desired resonant frequency (or range thereof) for the resonator arrangement 200. In the illustrated embodiment, each transmission line element 220, 222, 224, 226, 228, 230 is realized as a microstrip line formed overlying the substrate 201. Although FIG. 2 depicts the transmission line elements 220, 222, 224, 226, 228, 230 individually and contacting or otherwise connecting to the adjacent transmission line element at their adjacent ends, in practice, the transmission line elements 220, 222, 224, 226, 228, 230 may be integrally formed. For example, a single microstrip line may be provided between node 244 and node 246 with the midpoint of the microstrip line coupled to the second control voltage node 242 and the variable capacitance elements 202, 204, 206, 208, 210, 212 spaced apart by appropriate distances along the microstrip line to provide the desired lengths 250, 252, 254, 256 of the microstrip line between the variable capacitance elements 202, 204, 206, 208, 210, 212.

Figure 3:
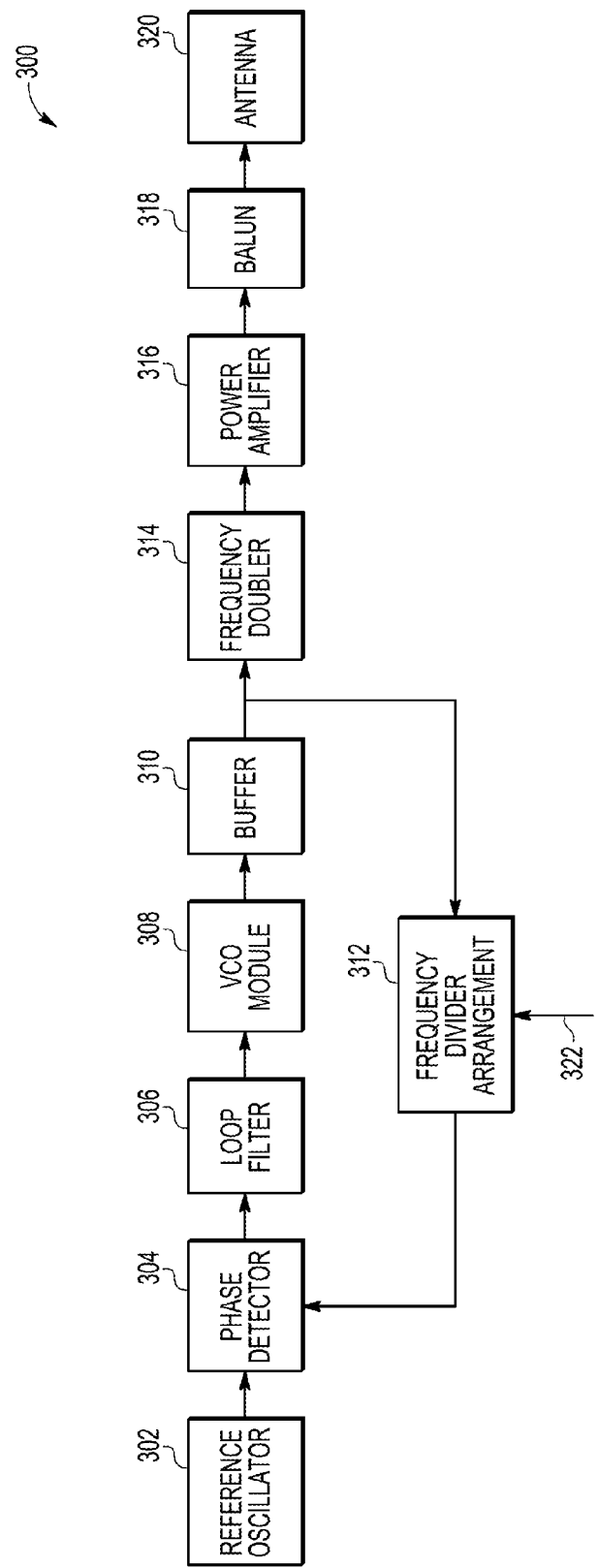
FIG. 3 is a block diagram of a transmitter system suitable for use with the voltage-controlled oscillator module of FIG. 1 in accordance with one embodiment of the invention.

FIG. 3 depicts an exemplary embodiment of a transmitter system 300 suitable for use with the VCO module 100 of FIG. 1. It should be understood that FIG. 3 is a simplified representation of a transmitter system for purposes of explanation and ease of description, and FIG. 3 is not intended to limit the application or scope of the subject matter in any way. Along these lines, it will be appreciated that the transmitter system 300 of FIG. 3 is merely one exemplary system that may utilize the VCO module 100 of FIG. 1, and the VCO module 100 of FIG. 1 may be utilized in a variety of different electrical systems and the VCO module 100 of FIG. 1 is not intended to be limited to implementation in any particular system.

The illustrated embodiment of the transmitter system 300 includes, without limitation, a reference oscillator 302, a phase detector 304, a loop filter 306, a VCO module 308, a buffer 310, a frequency divider arrangement 312, a frequency doubler 314, a power amplifier 316, a balun 318, and an antenna 320. In the illustrated embodiment of FIG. 3, the reference oscillator 302, the phase detector 304, the loop filter 306, the VCO module 308, the buffer 310, and the frequency divider arrangement 312 are configured as a phase-locked loop (PLL) that produces a frequency modulated oscillating signal having a desired oscillation frequency based on an input signal provided to an input 322 of the transmitter system 300, as described in greater detail below. In accordance with one or more embodiments, the transmitter system 300 is configured for automotive radar applications, wherein the VCO module 308 is configured for oscillation frequencies within the range of about 38 GHz to about 41 GHz and the frequency modulated signals transmitted by the antenna 320 have a frequency in the range of about 76 GHz to about 81 GHz. It should be understood that FIG. 3 is a simplified representation of a transmitter system 300 for purposes of explanation and ease of description, and FIG. 3 is not intended to limit the application or scope of the subject matter described herein in any way.

In the illustrated embodiment, the reference oscillator 302 is realized as an oscillator that generates a reference signal having a fixed reference frequency, such as, for example, a crystal oscillator. The phase detector 304 is coupled to the reference oscillator 302 and the frequency divider arrangement 312, and the phase detector 304 compares the reference signal from the reference oscillator to the feedback signal from the frequency divider arrangement 312 and generates an error signal based on the difference between the frequencies and/or phases of the feedback signal and the reference signal. In accordance with one embodiment, the error signal from the phase detector 304 comprises an 'up' or 'down' pulse that produces a corresponding increase or decrease in a reference voltage differential provided to the VCO module 308 that is proportional to the duration of the pulse. The loop filter 306 is an analog filter that filters the error signal from the phase detector 304 to obtain a reference voltage differential which varies based on differences (e.g., in frequency and/or phase) between the reference signal and the feedback signal until the feedback signal is in phase-lock with or otherwise matches the reference signal. It will be appreciated that the loop filter 306 also provides a dominant pole for the PLL, thereby ensuring stability for the PLL. The buffer 310 is coupled to the output of the VCO module 308 and prevents the resulting load from the frequency divider arrangement 312 and/or frequency doubler 314 from undesirably impacting the oscillation frequency of the VCO module 308. The frequency divider arrangement 312 is coupled between the output of the VCO module 308 (via the buffer 310) and the input to the phase detector 304, and the frequency divider arrangement 312 is configured to generate or otherwise provide the feedback signal at a frequency that is equal to a fraction of the oscillation frequency of the oscillating signal(s) from the VCO module 308, wherein the fractional amount is determined based on the input signal provided at the input 322 of the transmitter system 300. In an exemplary embodiment, the frequency divider arrangement 312 is configured to support or otherwise implement frequency modulated continuous wave signals generated by the PLL that are representative of the input signal received at the input 322. In this regard, although not illustrated in FIG. 3, in practice, the frequency divider arrangement 312 may include modulators, ramp generators, and other components suitably configured to support frequency modulation, as will be appreciated in the art.

In an exemplary embodiment, the VCO module 308 is realized as a VCO module 100 as described above in the context of FIG. 1, wherein the reference voltage differential from the loop filter 306 is provided to the control voltage nodes 110, 112 to control the capacitance of the variable capacitance elements 120, 122, 124, 126, 128, 130, and thereby, the oscillation frequency of the differential oscillating signals at the output nodes 104, 106, which are representative of frequency modulated signals to be transmitted by the transmitter system 300. It should be noted that in other embodiments, the VCO module 100 may be utilized in a non-differential manner and/or the PLL for the transmitter system 300 may be implemented in a non-differential manner by coupling only one of the control voltage nodes (e.g., control voltage node 110) to the output of the loop filter 306 while the other control voltage node (e.g., control voltage node 112) to a fixed reference voltage. In the illustrated embodiment, the output of the VCO module 308 (e.g., output nodes 104, 106) is coupled to the frequency doubler 314 (via buffer 310), which doubles the frequency of the differential oscillating signals received from the output nodes 104, 106. The output of the frequency doubler 314 is provided to a power amplifier 316, which amplifies the differential oscillating signals. The output of the power amplifier 316 is provided to the input of a balun 318, which is configured to convert the amplified differential oscillating signal to a single-ended oscillating signal with the same oscillating frequency. In an exemplary embodiment, the antenna 320 is realized as a conductive element that is coupled to the output of the balun 318 and configured to generate or otherwise produce electromagnetic waves at a frequency corresponding to the frequency of the single-ended oscillating signal received from the balun 318. In this manner, the antenna 320 transmits or otherwise emits an electromagnetic signal having a frequency that is influenced by the oscillating frequency of the oscillating signals provided by the VCO module 308, which in this example, corresponds to twice the oscillating frequency of the VCO module 308 by virtue of the frequency doubler 314. For example, if the VCO module 308 is producing oscillating signals with an oscillation frequency of 39 GHz, the antenna 320 transmits frequency modulated electromagnetic signals having a frequency of 78 GHz. In this regard, by virtue of the resonator arrangement 108 described herein, the VCO module 308 produces oscillating signals with the desired oscillation frequency (e.g., 39 GHz) with reduced phase noise and/or greater power efficiency (e.g., increased power output for the same power input) by virtue of the variable capacitance elements 120, 122, 124, 126, 128, 130 being distributed by transmission lines 132, 134, 136, 138 to increase the quality factor of the resonator arrangement 108, as described above.

For the sake of brevity, conventional techniques related to electronic oscillators and/or VCOs, resonators and/or tank circuits, variable capacitance elements and/or varactors, transmission lines and/or microstrip lines, analog circuit design, PLLs, transmitters, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

In conclusion, systems, devices, and apparatus configured in accordance with exemplary embodiments of the invention relate to:

An apparatus for a voltage-controlled oscillator is provided. The exemplary voltage-controlled oscillator includes a first node to receive a first voltage, a second node to receive a second voltage, a third node, a fourth node for providing an oscillating signal, a first inductive element coupled in series between the second node and the third node, a first variable capacitance element coupled in series between the first node and the fourth node, a second variable capacitance element coupled in series between the first node and the third node, and a second inductive element coupled between the third node and the fourth node to provide an inductance between the third node and the fourth node at an oscillation frequency of the oscillating signal. In one embodiment, the second inductive element is a conductive element or transmission line element having a length that is non-negligible with respect to a wavelength of the oscillating signal. In a further embodiment, the length of the conductive element is greater than a hundredth of the wavelength of the oscillating signal. In another embodiment, the second inductive element is a transmission line element having a length greater than a hundredth of a wavelength of the oscillating signal. In one embodiment, the transmission line element is a microstrip line. In yet another embodiment, the second inductive element is an inductor having the inductance that is non-negligible at the oscillation frequency. In another embodiment, the inductance is configured to provide an AC voltage difference between the first variable capacitance element and the second variable capacitance element. In one embodiment, the AC voltage difference is greater than five percent of an amplitude of the oscillating signal. In another embodiment, the first variable capacitance element is a first varactor having its cathode terminal connected to the first node and its anode terminal connected to the fourth node, the second variable capacitance element is a second varactor having its cathode terminal connected to the first node and its anode terminal connected to the third node, and the inductance provides an AC voltage difference between the anode terminal of the first varactor and the anode terminal of the second varactor. In yet another embodiment, the first voltage is a first DC tuning voltage, the second voltage is a second DC tuning voltage, a first capacitance of the first variable capacitance element is based on a first voltage difference between the first node and the fourth node, and a second capacitance of the second variable capacitance element is based on a second voltage difference between the first node and the third node. In another embodiment, the first variable capacitance element and the second variable capacitance element are distributed between the third node and the fourth node.

In accordance with one or more embodiments, the voltage-controlled oscillator includes an oscillator arrangement coupled to the fourth node, wherein the oscillator arrangement facilitates generation of the oscillating signal. In one embodiment, the voltage-controlled oscillator further includes a fifth node and a sixth node coupled to the oscillator arrangement, the oscillator arrangement facilitating generation of a second oscillating signal that is complementary to the oscillating signal at the fourth node at the sixth node. A third variable capacitance element is coupled in series between the first node and the sixth node, a fourth variable capacitance element is coupled in series between the first node and the fifth node, a third inductive element is coupled in series between the second node and the fifth node, and a fourth inductive element is coupled in series between the fifth node and the sixth node to provide a second inductance between the fifth node and the sixth node. In one embodiment, the voltage-controlled oscillator further includes a seventh node, wherein the second inductive element is coupled in series between the fourth node and the seventh node, and an eighth node, wherein the fourth inductive element is coupled in series between the sixth node and the eighth node. A fifth variable capacitance element is coupled in series between the first node and the seventh node, a fifth inductive element is coupled in series between the seventh node and the third node, a sixth variable capacitance element is coupled in series between the first node and the eighth node, and a sixth inductive element is coupled in series between the eighth node and the fifth node. In one embodiment, the oscillator arrangement includes a first transistor having a drain terminal coupled to the fourth node and a gate terminal coupled to the sixth node, and a second transistor having a drain terminal coupled to the sixth node and a gate terminal coupled to the fourth node.

In accordance with another embodiment, a voltage-controlled oscillator comprises a first node to receive a first DC control voltage, a second node to receive a second DC control voltage, a third node, a fourth node for providing an oscillating signal, an inductive element coupled between the second node and the third node, and a plurality of variable capacitance elements distributed between the third node and the fourth node, wherein each variable capacitance element of the plurality has a first terminal coupled to the first node, and an inductance is provided between second terminals of a pair of the variable capacitance elements at an oscillating frequency of the oscillating signal.

In yet another embodiment, a voltage-controlled oscillator module for generating an oscillating signal includes an active-circuit arrangement to facilitate the oscillating signal at an output node and a resonator arrangement coupled to the output node. The resonator arrangement includes a first variable capacitance element coupled in series between the output node and a first node corresponding to a first DC tuning voltage, a second variable capacitance element coupled in series between the first node and a second node, a first inductive element coupled between the output node and the second node to provide an inductance between the output node and the second node at an oscillating frequency of the oscillating signal, and a second inductive element coupled in series between the second node and a third node corresponding to a second DC tuning voltage. In a further embodiment, the active-circuit arrangement facilitates a second oscillating signal having the oscillating frequency at a second output node, wherein the resonator arrangement further includes a third variable capacitance element coupled in series between the second output node and the first node, a fourth variable capacitance element coupled in series between the first node and a fourth node, a third inductive element coupled between the second output node and the fourth node to provide a second inductance between the second output node and the fourth node at the oscillating frequency, and a fourth inductive element coupled in series between the second node and the third node. In yet another embodiment, an apparatus is provided for a transmitter that includes the voltage-controlled oscillator module, and further includes an antenna coupled to the voltage-controlled oscillator module to transmit an electromagnetic signal having a transmission frequency that is influenced by the oscillating frequency. For example, the transmission frequency may be a multiple of the oscillating frequency.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A voltage-controlled oscillator comprising:
a first node to receive a first DC voltage;
a second node to receive a second DC voltage;
a third node;
a fourth node for providing an oscillating signal;
a first inductive element coupled in series between the second node and the third node;
a first variable capacitance element connected between the first node and the fourth node;
a second variable capacitance element connected between the first node and the third node; and
a second inductive element coupled between the third node and the fourth node to provide an inductance at an oscillation frequency of the oscillating signal in series between the third node and the fourth node that results in a current flowing to/from the second variable capacitance element being less than a current flowing to/from the first variable capacitance element.

2. The voltage-controlled oscillator of claim 1, wherein the second inductive element comprises a conductive element having a length that is non-negligible with respect to a wavelength of the oscillating signal.

3. The voltage-controlled oscillator of claim 2, wherein the length of the conductive element is greater than a hundredth of the wavelength.

4. The voltage-controlled oscillator of claim 1, wherein the second inductive element comprises a transmission line element having a length greater than a hundredth of a wavelength of the oscillating signal.

5. The voltage-controlled oscillator of claim 4, wherein the transmission line element comprises a microstrip line.

6. The voltage-controlled oscillator of claim 1, wherein:
the second inductive element comprises an inductor having the inductance; and
the inductance is non-negligible at the oscillation frequency.

7. A voltage-controlled oscillator comprising:
a first node to receive a first voltage;
a second node to receive a second voltage;
a third node;
a fourth node for providing an oscillating signal;
a first inductive element coupled between the second node and the third node;
a first variable capacitance element coupled between the first node and the fourth node;
a second variable capacitance element coupled between the first node and the third node; and
a second inductive element coupled between the third node and the fourth node to provide an inductance between the third node and the fourth node at an oscillation frequency of the oscillating signal, wherein the inductance is configured to provide an AC voltage difference between the first variable capacitance element and the second variable capacitance element that is greater than five percent of an amplitude of the oscillating signal.

8. The voltage-controlled oscillator of claim 1, further comprising an oscillator arrangement coupled to the fourth node, the oscillator arrangement facilitating generation of the oscillating signal.

9. A voltage-controlled oscillator comprising:
a first node to receive a first voltage;
a second node to receive a second voltage;
a third node;
a fourth node;
a first inductive element coupled between the second node and the third node;
a first variable capacitance element coupled between the first node and the fourth node;
a second variable capacitance element coupled between the first node and the third node;

a second inductive element coupled between the third node and the fourth node to provide an inductance between the third node and the fourth node at an oscillation frequency of an oscillating signal;
a fifth node;
a sixth node;
an oscillator arrangement coupled to the fourth node and the sixth node, the oscillator arrangement facilitating generation of the oscillating signal at the fourth node and a second oscillating signal at the sixth node, the second oscillating signal being complementary to the oscillating signal at the fourth node;
a third variable capacitance element coupled between the first node and the sixth node;
a fourth variable capacitance element coupled between the first node and the fifth node;
a third inductive element coupled between the second node and the fifth node; and
a fourth inductive element coupled between the fifth node and the sixth node to provide a second inductance between the fifth node and the sixth node.

10. The voltage-controlled oscillator of claim 9, further comprising:
a seventh node, wherein the second inductive element is coupled in series between the fourth node and the seventh node;
a fifth variable capacitance element coupled in series between the first node and the seventh node;
a fifth inductive element coupled in series between the seventh node and the third node;
an eighth node, wherein the fourth inductive element is coupled in series between the sixth node and the eighth node;
a sixth variable capacitance element coupled in series between the first node and the eighth node; and
a sixth inductive element coupled in series between the eighth node and the fifth node.

11. The voltage-controlled oscillator of claim 9, wherein the oscillator arrangement comprises:
a first transistor having a drain terminal coupled to the fourth node and a gate terminal coupled to the sixth node; and
a second transistor having a drain terminal coupled to the sixth node and a gate terminal coupled to the fourth node.

12. The voltage-controlled oscillator of claim 1, wherein:
the first variable capacitance element comprises a first varactor having its cathode terminal connected to the first node and its anode terminal connected to the fourth node; and
the second variable capacitance element comprises a second varactor having its cathode terminal connected to the first node and its anode terminal connected to the third node.

13. The voltage-controlled oscillator of claim 12, wherein the inductance provides an AC voltage difference between the anode terminal of the first varactor and the anode terminal of the second varactor.

14. The voltage-controlled oscillator of claim 1, wherein:
the first DC voltage is a first DC tuning voltage;
the second DC voltage is a second DC tuning voltage;
a first capacitance of the first variable capacitance element is based on a first voltage difference between the first node and the fourth node; and
a second capacitance of the second variable capacitance element is based on a second voltage difference between the first node and the third node.

15. The voltage-controlled oscillator of claim 1, wherein the first variable capacitance element and the second variable capacitance element are distributed between the third node and the fourth node.

16. A voltage-controlled oscillator comprising:
a first node to receive a first DC control voltage;
a second node to receive a second DC control voltage;
a third node;
an output node for providing an oscillating signal;
an inductive element coupled in series between the second node and the third node; and
a plurality of variable capacitance elements distributed between the third node and the output node, wherein:
each variable capacitance element of the plurality has a cathode terminal coupled to the first node; and
an inductance at an oscillating frequency of the oscillating signal is provided in series between anode terminals of a pair of the variable capacitance elements to provide an alternating current (AC) voltage difference between the anode terminals.

17. A voltage-controlled oscillator module to generate an oscillating signal, the voltage-controlled oscillator module comprising:
an active-circuit arrangement to facilitate the oscillating signal at an output node and a second oscillating signal having the oscillating frequency at a second output node; and
a resonator arrangement coupled to the output node, the resonator arrangement comprising:
a first variable capacitance element coupled in series between the output node and a first node corresponding to a first DC tuning voltage;
a second variable capacitance element coupled in series between the first node and a second node;
a first inductive element coupled between the output node and the second node to provide an inductance between the output node and the second node at an oscillating frequency of the oscillating signal;
a second inductive element coupled between the second node and a third node corresponding to a second DC tuning voltage;
a third variable capacitance element coupled in series between the second output node and the first node;
a fourth variable capacitance element coupled in series between the first node and a fourth node;
a third inductive element coupled between the second output node and the fourth node to provide a second inductance between the second output node and the fourth node at the oscillating frequency; and
a fourth inductive element coupled in series between the second node and the third node.

18. A transmitter including the voltage-controlled oscillator module of claim 17, further comprising an antenna coupled to the voltage-controlled oscillator module to transmit an electromagnetic signal having a frequency influenced by the oscillating frequency.

19. The voltage-controlled oscillator of claim 1, further comprising a transistor, wherein a terminal of the transistor is connected to the fourth node.

20. The voltage-controlled oscillator of claim 1, wherein the inductance is configured to provide an AC voltage difference between the fourth node and the third node.

* * * * *